US009188881B2

(12) United States Patent
Dierichs et al.

(10) Patent No.: US 9,188,881 B2
(45) Date of Patent: Nov. 17, 2015

(54) LITHOGRAPHIC APPARATUS AND METHOD FOR REDUCING STRAY RADIATION

(75) Inventors: Marcel Mathijs Theodore Marie Dierichs, Venlo (NL); Markus Franciscus Antonius Eurlings, Tilburg (NL); Hendrikus Robertus Marie Van Greevenbroek, Eindhoven (NL); Antonie Hendrik Verweij, Dussen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 308 days.

(21) Appl. No.: 13/376,761

(22) PCT Filed: May 4, 2010

(86) PCT No.: PCT/EP2010/056006

§ 371 (c)(1), (2), (4) Date: Dec. 7, 2011

(87) PCT Pub. No.: WO2010/142497

PCT Pub. Date: Dec. 16, 2010

(65) Prior Publication Data

US 2012/0075610 A1 Mar. 29, 2012

Related U.S. Application Data

(60) Provisional application No. 61/185,487, filed on Jun. 9, 2009.

(51) Int. Cl.
*G03B 27/72* (2006.01)
*G03F 7/20* (2006.01)

(52) U.S. Cl.
CPC ........ *G03F 7/70941* (2013.01); *G03F 7/70066* (2013.01); *G03F 7/70075* (2013.01); *G03F 7/70283* (2013.01)

(58) Field of Classification Search
CPC ............ G03F 7/70066; G03F 7/70075; G03F 7/70283; G03F 7/70941
USPC ........................ 355/67, 77, 43, 51, 57, 71, 74
See application file for complete search history.

(56) References Cited

U.S. PATENT DOCUMENTS 5,486,896 A * 1/1996 Hazama et al. ................ 355/71
5,854,671 A * 12/1998 Nishi ............................. 355/53

(Continued)

FOREIGN PATENT DOCUMENTS

CN 1667515 A 9/2005
CN 101523293 A 9/2009

(Continued)

OTHER PUBLICATIONS

Machine translation of JP 2008-205377 A.*

(Continued)

*Primary Examiner* — Deoram Persaud
(74) *Attorney, Agent, or Firm* — Pillsbury Winthrop Shaw Pittman LLP

(57) ABSTRACT

A lithographic apparatus includes an illumination system for providing a beam of extreme ultra-violet radiation, a masking device for controlling the illumination of a patterning device by the beam of radiation, a support for supporting the patterning device, the patterning device configured to impart a pattern to the beam of radiation, a substrate table for holding a substrate, and a projection system for projecting the patterned beam of radiation onto a target portion of the substrate. The masking device includes a masking blade including a masking edge configured to delimit a boundary of an illumination region on the patterning device. The masking blade is configured to reflect extreme ultra-violet radiation incident on the masking blade such that at least a portion of the reflected radiation is not captured by the projection system.

14 Claims, 4 Drawing Sheets

(56) References Cited

U.S. PATENT DOCUMENTS

| | | | | |
|---|---|---|---|---|
| 6,608,722 | B2 * | 8/2003 | Cowan et al. | 359/599 |
| 7,145,269 | B2 | 12/2006 | Hol et al. | |
| 7,629,594 | B2 | 12/2009 | Van Herpen et al. | |
| 8,405,893 | B2 | 3/2013 | Bauernschmid et al. | |
| 8,441,611 | B2 * | 5/2013 | Van Greevenbroek | 355/67 |
| 2002/0014600 | A1 * | 2/2002 | Sato et al. | 250/548 |
| 2002/0186811 | A1 * | 12/2002 | Weiss et al. | 378/34 |
| 2003/0063266 | A1 | 4/2003 | Leenders et al. | |
| 2003/0067591 | A1 * | 4/2003 | Komatsuda | 355/67 |
| 2004/0012764 | A1 * | 1/2004 | Mulder et al. | 355/53 |
| 2004/0136038 | A1 * | 7/2004 | Holmes et al. | 359/15 |
| 2005/0012913 | A1 * | 1/2005 | Verweij et al. | 355/53 |
| 2005/0157285 | A1 | 7/2005 | Schothorst et al. | |
| 2005/0162629 | A1 * | 7/2005 | Moors et al. | 355/67 |
| 2005/0237503 | A1 | 10/2005 | Kubo | |
| 2005/0270513 | A1 | 12/2005 | Dierichs et al. | |
| 2006/0268247 | A1 | 11/2006 | Butler | |
| 2006/0270226 | A1 * | 11/2006 | Hosoya | 438/686 |
| 2007/0014112 | A1 * | 1/2007 | Ohya et al. | 362/268 |
| 2007/0146673 | A1 * | 6/2007 | Terashi | 355/67 |
| 2007/0211236 | A1 * | 9/2007 | Shinonaga | 355/67 |
| 2008/0083885 | A1 | 4/2008 | Van Herpen et al. | |
| 2009/0002676 | A1 * | 1/2009 | Van Schothorst et al. | 355/71 |
| 2009/0046265 | A1 * | 2/2009 | Komatsuda | 355/53 |
| 2010/0141922 | A1 * | 6/2010 | Komatsuda | 355/71 |

FOREIGN PATENT DOCUMENTS

| | | | |
|---|---|---|---|
| DE | 102007022109 | | 11/2008 |
| JP | 8-227071 | | 9/1996 |
| JP | 2000-131686 | | 5/2000 |
| JP | 2003-128747 | | 5/2003 |
| JP | 2004-356291 | | 12/2004 |
| JP | 2005-79555 | | 3/2005 |
| JP | 2005-86148 | | 3/2005 |
| JP | 2007-151685 | | 6/2007 |
| JP | 2008-205377 | | 9/2008 |
| JP | 2009-44146 | | 2/2009 |
| WO | WO 2009/022506 | * | 2/2009 |

OTHER PUBLICATIONS

International Search Report for PCT International Patent Application No. PCT/EP2010/056006, mailed Jul. 1, 2010.

* cited by examiner

LITHOGRAPHIC APPARATUS AND METHOD FOR REDUCING STRAY RADIATION

CROSS-REFERENCE TO RELATED APPLICATIONS

This application is the National Phase entry of PCT/EP2010/056006, filed May 4, 2010, which claims the benefit of U.S. provisional application No. 61/185,487 which was filed on Jun. 9, 2009, both of which is are incorporated herein by reference in their entireties.

FIELD

The present invention relates to a lithographic apparatus comprising a masking device, and to a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC. This pattern can be transferred onto a target portion (e.g. comprising part of a die, one die, or several dies) of a substrate (e.g. a silicon wafer). The pattern is typically transferred onto the target portion via imaging onto a layer of radiation sensitive material (resist) provided on the substrate. In general, a single substrate will contain a network of adjacent target portions that are successively patterned.

A conventional lithographic apparatus comprises an illumination system, a support to hold a patterning device and a projection system. The illumination system is arranged between a radiation source (for example, an extreme ultra-violet radiation plasma source) and the patterning device support. The illumination system is configured to receive radiation from the source, produce a beam of radiation and project the beam of radiation onto the patterning device. The beam of radiation is patterned by the patterning device. The projection system is arranged between the patterning device support and the substrate. The projection system is configured to project the patterned beam of radiation onto the target portion of the substrate.

Stray radiation in a lithographic apparatus may reduce the accuracy with which a pattern is projected onto a substrate.

SUMMARY

It is desirable, for example, to provide a lithographic apparatus which reduces the amount of stray radiation that is projected onto a substrate.

According to an aspect, there is provided a lithographic apparatus comprising an illumination system configured to condition a beam of extreme ultra-violet radiation, a support configured to hold a patterning device, the patterning device configured to impart a pattern to the beam of radiation, a substrate table configured to hold a substrate; a projection system configured to project the patterned beam of radiation onto a target portion of the substrate, and a masking device configured to control illumination of the patterning device by the beam of radiation, the masking device comprising a masking blade configured to reflect radiation incident on the masking blade such that at least a portion of the reflected radiation is not captured by the projection system.

According to an aspect, there is provided a method of controlling reflection of extreme ultra-violet radiation in a lithographic apparatus, the method comprising projecting a beam of extreme ultra-violet radiation toward a patterning device of the lithographic apparatus, and using a masking blade before the patterning device in the optical path of the beam to reflect at least a portion of the radiation at an angle which is equal to or greater than a certain angle, such that at least a portion of the reflected radiation is not captured by a projection system of the lithographic apparatus.

According to an aspect, there is provided a method of controlling the reflection of radiation in a lithographic apparatus, the method comprising providing a masking device in an optical path of a beam of radiation between an illumination system and a patterning device of the lithographic apparatus, the masking device comprising a masking blade configured to reflect at least a portion of radiation delivered from the illumination system, and using the masking blade to reflect the radiation at an angle which is equal to or greater than a certain angle, such that at least a portion of the reflected radiation is not captured by a projection system of the lithographic apparatus.

According to an aspect, there is provided a masking device for a patterning device in a lithographic apparatus, the masking device comprising a masking surface having a diffusing region, wherein the diffusing region is configured to reflect extreme ultra-violet radiation such that at least a portion of the reflected radiation falls outside the angular capture range of a projection system of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 7:
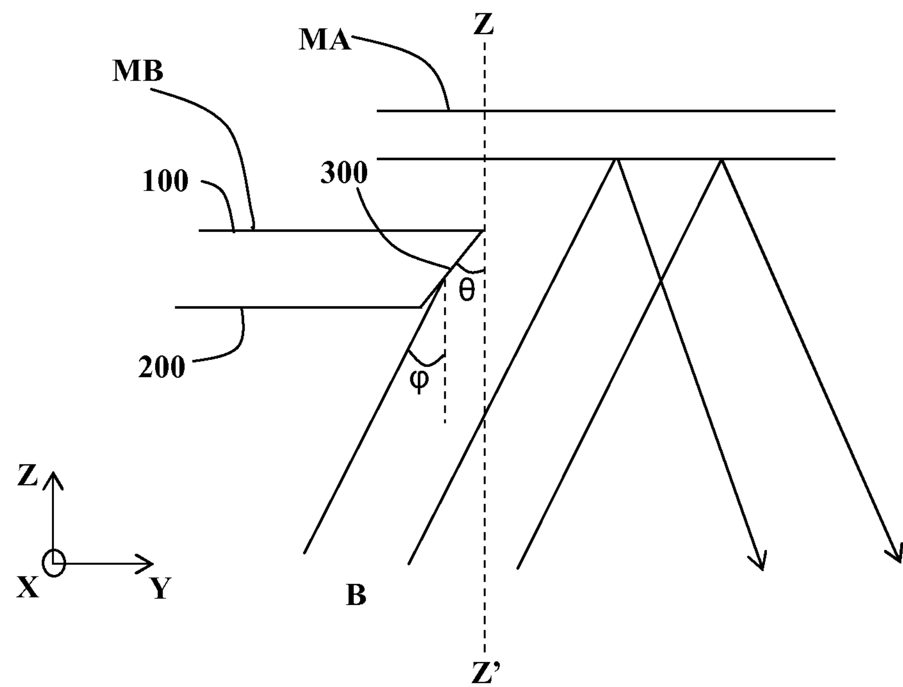

FIG. **6*a*** schematically depicts a masking blade of the lithographic apparatus according to an embodiment of the invention;

FIG. **6*b* schematically depicts a further masking blade of the lithographic apparatus according to an embodiment of the invention; and FIG. 7** schematically depicts a further masking blade of the lithographic apparatus according to an embodiment of the invention.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms “wafer” or “die” herein may be considered as synonymous with the more general terms “substrate” or “target portion”, respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365 nm), deep ultraviolet (DUV) radiation (e.g. having a wavelength of 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Typically, in an EUV lithographic apparatus, the patterning device is reflective. Examples of patterning device include masks (transmissive), programmable mirror arrays (reflective), and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A "support structure" holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems and/or catadioptric optical systems, as appropriate for example for the exposure radiation being used, or for other factors such as the use of an immersion fluid or the use of a vacuum. Usually, in an EUV radiation lithographic apparatus the optical elements of the projection system will be reflective. Any use of the term "projection lens" herein may be considered as synonymous with the more general term "projection system".

The illumination system includes reflective optical components and optionally various other types of optical components for directing, shaping and controlling the beam of radiation.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in United States patent application publication no. US 2007-0013890.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Figure 1:
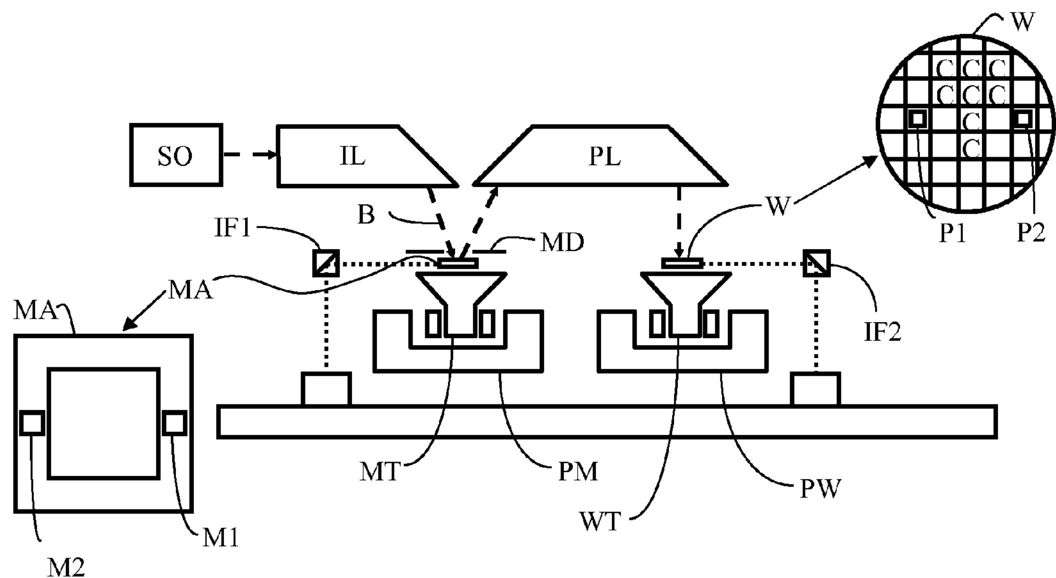
FIG. 1 schematically depicts a lithographic apparatus according to an embodiment of the invention.

FIG. 1 schematically depicts a lithographic apparatus according to an embodiment of the invention. The apparatus comprises:

an illumination system (illumination system) IL to condition a beam of radiation B (e.g. UV radiation or EUV radiation);

a masking device MD to control the irradiation of a patterning device (e.g. a mask) MA by the beam of radiation B;

a support structure (e.g. a mask table) MT to support the patterning device MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL; and a projection system (e.g. a reflective projection lens) PL configured to image a pattern imparted to the radiation beam B by patterning device MA onto a target portion C (e.g. comprising one or more dies) of the substrate W.

With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 can be used to accurately position the patterning device MA with respect to the path of the radiation beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignments marks). Similarly, in situations in which more than one die is provided on the patterning device MA, the patterning device alignment marks may be located between the dies.

The depicted apparatus can be used in the following preferred modes:

1. In step mode, the support structure MT and the substrate table WT are kept essentially stationary, while an entire pattern imparted to the radiation beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
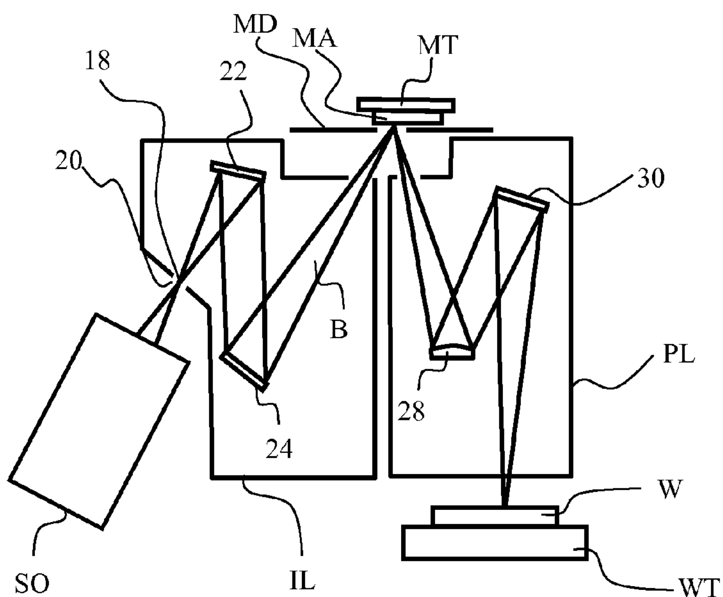
FIG. 2 schematically depicts part of the lithographic apparatus of FIG. 1 in more detail.

FIG. 2 schematically depicts a more detailed side view of the lithographic apparatus of FIG. 1, but still in schematic form.

As depicted in FIGS. 1 and 2, the lithographic apparatus is a reflective type apparatus (e.g. employing a reflective patterning device or programmable mirror array of a type referred to above). Alternatively, the apparatus may be a transmissive type apparatus (e.g. employing a transmissive mask).

The illumination system IL receives a beam of radiation B from a radiation source SO. More specifically, the source SO generates a radiation beam B which is focused to a virtual source point collection focus 18 at an entrance aperture 20 in the illumination system IL. The source and the lithographic apparatus may be separate entities, for example when the source is an excimer laser. In such cases, the source is not considered to form part of the lithographic apparatus, and the radiation beam B is passed from the source SO to the illumination system IL with the aid of a beam delivery system comprising for example suitable directing mirrors and/or a beam expander. In other cases the source may be integral part of the apparatus, for example when the source is a mercury lamp. The source SO and the illumination system IL, together with the beam delivery system if required, may be referred to as a radiation system. It will be appreciated that a source SO typically may generate radiation of one or more further wavelengths in addition to the desired exposure radiation. For example, the source SO for an EUV lithographic apparatus may generate deep ultraviolet (DUV) radiation, ultraviolet (UV) radiation, visible light and/or infrared (IR) radiation in addition to extreme ultra-violet (EUV) radiation.

The illumination system IL conditions the beam of radiation B using first and second reflective components 22, 24. The beam of radiation B is conditioned so as to provide a beam of radiation with a desired uniformity and a desired illumination mode.

Upon leaving the illumination system IL, the radiation beam B is incident on the patterning device (e.g. mask) MA, which is held on the support structure MT. The masking device MD controls the incidence of the radiation beam B on the patterning device MA.

The radiation beam B is patterned by the patterning device MA and reflected towards the projection system PL. Following reflection by the patterning device MA, the patterned radiation beam B is captured by the projection system PL, which focuses the beam onto a target portion C of the substrate W. Having been captured by the projection system, the patterned beam of radiation is projected onto a target portion C of the substrate W via first and second reflective elements 28, 30. The projection system PL projects the patterned beam onto the target portion C of the substrate W so as to apply a desired pattern onto the target portion C.

More or fewer elements than shown in FIG. 2 may generally be present in the source, illumination system IL and projection system PL. For instance, in some embodiments the lithographic apparatus may also comprise one or more transmissive or reflective spectral purity filters. More or less reflective component parts may be present in the lithographic apparatus.

The projection system PL captures radiation and subsequently projects the captured radiation onto the substrate W. The numerical aperture NAin at the entrance of the projection system PL is a measure of the ability of the projection system PL to capture radiation. The numerical aperture NAin at the entrance of the projection system PL determines the angular capture range ACR of the projection system PL (i.e. the range of angles over which the projection system PL can capture radiation).

Figure 3:
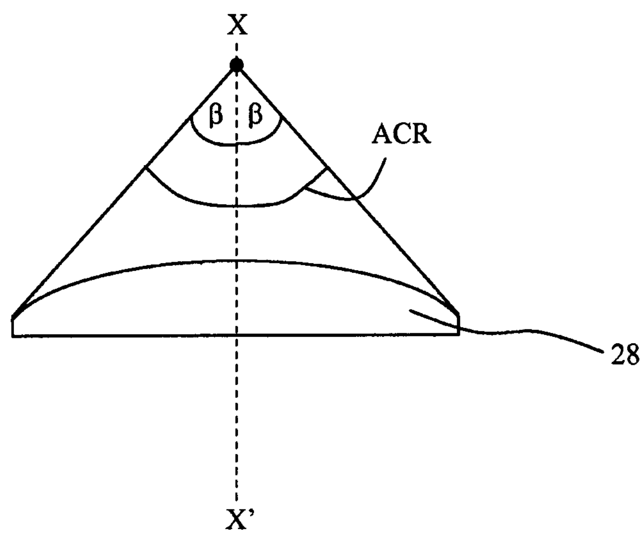
FIG. 3 schematically depicts an angular capture range of an optical component.

FIG. 3 depicts the angular capture range ACR at the first reflective element 28 of the projection system PL previously depicted in FIGS. 1 and 2. It can be seen from FIG. 3 that the angular capture range ACR of the projection system PL may be defined by equation 1:

$$ACR=2\beta \qquad 1$$

where β is the maximum angle of incidence of radiation that is captured by the projection system PL (i.e. the half-angle of the angular capture range). As shown in FIG. 3, angle β is measured relative to an axis XX' that is perpendicular to the first optical element, e.g., reflective element 28, of the projection system PL. The numerical aperture NAin at the inlet of the projection system PL is defined by equation 2:

$$NAin=n \sin \beta \qquad 2$$

where n is the index of refraction of the medium in which the projection system PL is located, and angle β is the maximum angle of incidence at which radiation is captured by the projection system PL.

Any radiation which is incident at the entrance of the projection system PL at an angle of incidence that is equal to or less than angle β falls within the angular capture range ACR, and is captured by the projection system PL. However, radiation incident at the projection system PL with an angle of incidence that is greater than angle β falls outside the angular capture range ACR, and therefore is not captured by the projection system PL.

As mentioned above, the lithographic apparatus comprises a masking device MD. The masking device MD is provided to control the illumination of the patterning device MA by the radiation beam B. As depicted in both FIGS. 1 and 2, the masking device MD is arranged between the illumination system IL and the patterning device MA. The masking device MD comprises at least one masking blade that is arranged in the optical path of the radiation beam B in the vicinity of the patterning device.

Figure 4:
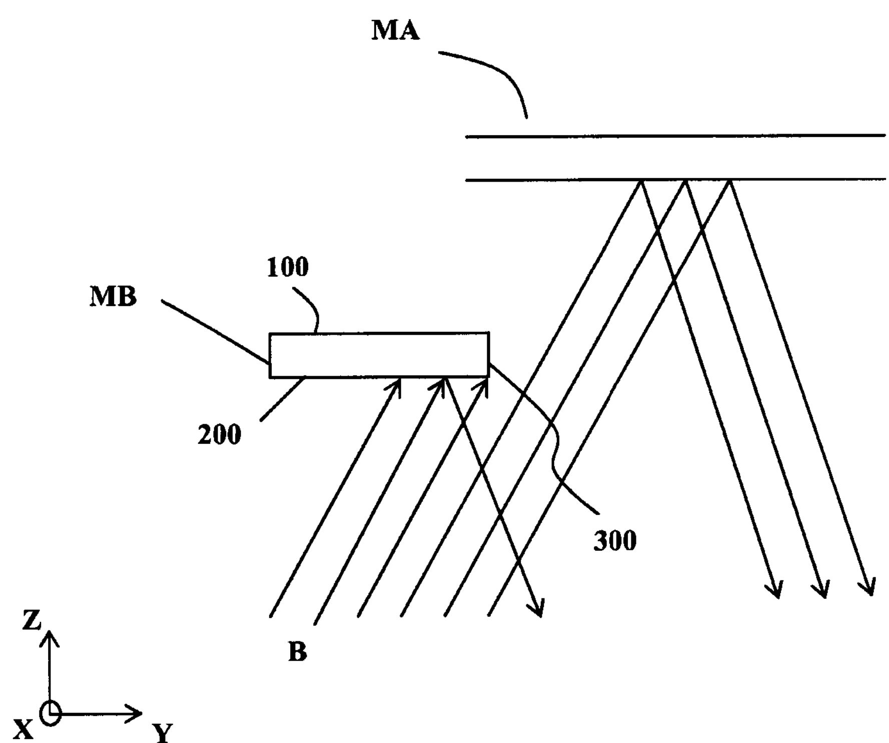
FIGS. 4 and 5 schematically depict prior art masking blades.

FIG. 4 depicts, viewed from one side, an example of a prior art masking blade MB of a masking device MD arranged in the optical path of the radiation beam B in front of the patterning device MA. The masking blade MB depicted in FIG. 4 is an opaque, elongate member comprising a first surface 100, a second surface 200 and a third surface 300. The first surface 100 is a surface substantially facing the patterning device MA. The second surface 200 is a surface substantially facing away from the patterning device MA. The third surface 300 extends between the first surface and the second surface.

It can be seen in FIG. 4 that the masking blade MB is arranged so as to mask or shield part of the radiation beam B projected by the illumination system IL towards the patterning device MA. The second surface 200 acts as a masking surface by masking the incident radiation. The third surface 300 of the masking blade MB is a masking edge that delimits or demarcates a boundary of an illumination region on the patterning device MA. The masking edge 300 may be substantially linear. Alternatively, the masking edge may have an arcuate profile, so as to define an arcuate boundary of the exposure region on the patterning device MA.

Figure 5:
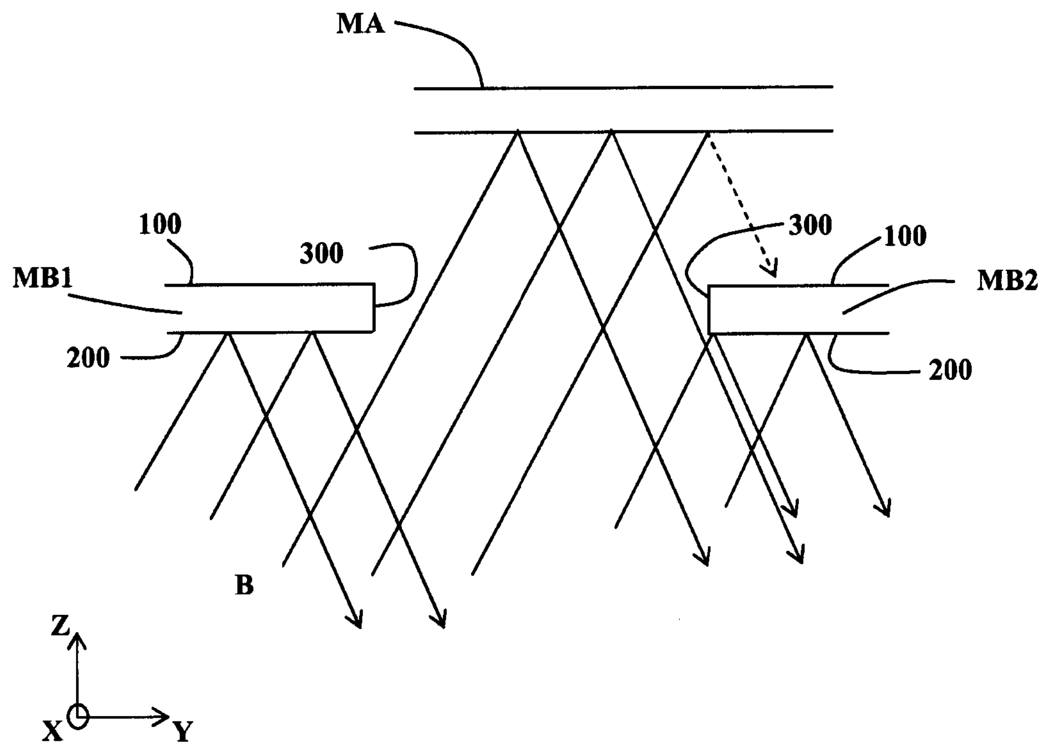

The masking device MD may comprise at least one pair of masking blades MB to control the illumination region on the patterning device MA. FIG. 5 depicts a prior art masking device MD comprising a pair of masking blades MB1 and MB2. The pair of masking blades MB1, MB2 are arranged in parallel and spaced apart by a predetermined distance such that the masking edges of the masking blades MB1, MB2 define an opening (in the y-direction). Accordingly, the opening configured by the masking blades MB1, MB2 defines an illumination region on the patterning device MA, and thereby defines the exposure region on target portion C of the substrate W.

The masking device MD may comprise four independently movable masking blades MB configured as two pairs. The masking edges of one pair of masking blades may be aligned parallel to the exposure scan axis (e.g. parallel to the y-axis) and configured to delimit the width of the illumination region at the patterning device MA. The masking edges of the second pair of blades may be aligned orthogonal to the first pair of masking blades (e.g. parallel to the step axis, which in turn may be parallel to the x-axis) and configured to delimit the length of the illumination region. The masking blades are configured to form a central opening which in turn defines the illumination region at the patterning device MA. By moving one or both pairs of the masking blades, the size and shape of the illumination region at the patterning device, and thereby the exposure region on target portion C of the substrate, is manipulated.

A masking blade arranged parallel to the y-axis of the lithographic apparatus is typically referred to as an "x-axis masking blade", since it controls the extent of radiation in the x-direction. While a masking blade arranged parallel to the x-axis of the lithographic apparatus is typically referred to as a "y-axis masking blade", since it controls the extent of radiation in the y-direction.

In order to intercept or block incident radiation, each masking blade MB may be configured so as to substantially absorb incident radiation. The masking blade MB may comprise a metal material that is suitable for absorbing incident radiation. For example, a masking blade may comprise steel or any other suitable metallic material. Although a masking blade MB is generally effective at absorbing incident radiation, a proportion of incident radiation is reflected or scattered by the masking blade MB. It is appreciated that in the present context "reflected" refers to specular reflection from a reflective or partially reflective surface in accordance with the law of reflection, whereas "scattered" refers to any non-specular reflection.

In some instances, the intensity of the radiation beam B generated by the source SO may be such that it would cause an undesirable degree of heating of the masking blade MB. For this reason, the masking blade MB may be formed from a reflective material (e.g. polished aluminium).

As explained previously with respect to FIGS. 1 and 2, the optical components of the lithographic apparatus are configured such that radiation projected directly onto the patterning device MA is patterned and subsequently reflected towards the projection system PL such that it falls within the angular capture range of the projection system PL. Hence, the patterned radiation reflected by the patterning device MA is captured by the projection system PL and projected onto the target portion C of the substrate W.

The configuration of prior art masking blades MB is such that radiation reflected by a masking blade may also fall within the angular capture range of the projection system PL. The radiation may, for example, be reflected from the second surface 200 of the masking blade MB (as shown in FIGS. 4 and 5). Additionally, the radiation may, for example, be reflected from the third surface 300 of the masking blade MB. Radiation which has been reflected from the masking blade MB and captured by the projection system PL may be projected onto the substrate W.

Approximately 10% of DUV radiation with a wavelength of about 193 nm may be reflected by a conventional steel masking blade. Only around 0.2% of EUV radiation is reflected by a conventional steel masking blade when the EUV radiation is perpendicularly incident on the masking blade (or incident at angles close to the perpendicular). However, when EUV radiation is incident at a glancing angle on a steel surface, then approximately 100% of EUV radiation may be reflected by that steel surface. Therefore, it is possible that reflection of EUV radiation at approximately 100% efficiency could occur at the third surface 300 of a conventional masking blade.

Radiation reflected by a masking blade and projected onto the substrate W may have an exposing effect on resist provided on the substrate. This radiation is referred to here as "stray radiation". EUV and DUV wavelengths may have an exposing effect on the resist, whereas visible radiation or infrared radiation may have no effect on the resist. The stray radiation may cause heating of components of the projection system PL, and this may have a detrimental effect on the performance of those components. The stray radiation may produce background exposure "noise" when it irradiates the substrate, and thereby impair the imaging performance of the lithographic apparatus. For example, the stray radiation may cause ghost images on the substrate. The stray radiation may irradiate a border region extending around the target portion and thereby reduce the contrast between the irradiated target portion and border region. The stray radiation may reduce the resolution (i.e. critical dimension of smallest feature that can be imaged onto the substrate) and process latitude (i.e. depth of focus and insensitivity to residual errors in the doses of exposure of irradiated target portion) of the lithographic apparatus.

In order to control the reflection of radiation at the masking blade MB and thereby reduce or avoid the adverse effects of stray radiation at the substrate W, the masking blade MB is configured to reflect radiation such that at least a portion of reflected radiation is not captured by the projection system PL. The masking blade MB may be configured such that a majority portion or even substantially all of the reflected radiation is not captured by the projection system PL.

The reflection of radiation may be controlled by configuring the second surface of the masking blade to reflect radiation such that at least a portion of the reflected radiation does not fall within the angular capture range ACR of the projection system PL. Referring to, for example, FIG. 6, this may be achieved by providing a diffusing region 210 on the second surface 200. The diffusing region 210 may extend substantially across a region of the second surface 200 that is irradiated by radiation. The diffusing region 210 may comprise a non-planar surface which is configured so as to reflect radiation at a different angle from the second surface 200. The angle at which radiation is reflected from the second surface may be such that the reflected radiation does not fall within the angular capture range ACR of the projection system PL.

Figure 6A:
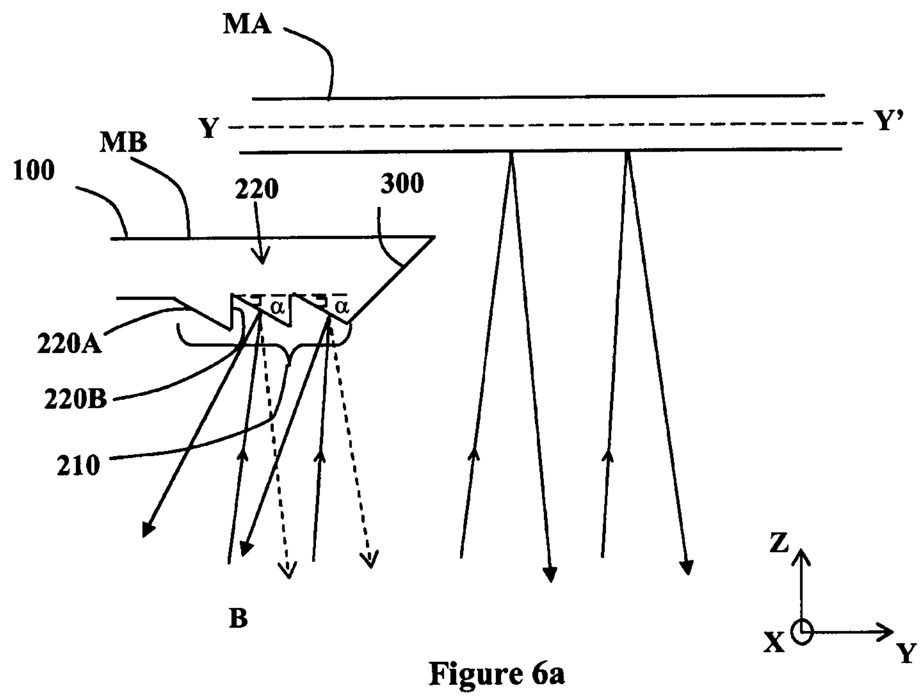
Figure 6B:
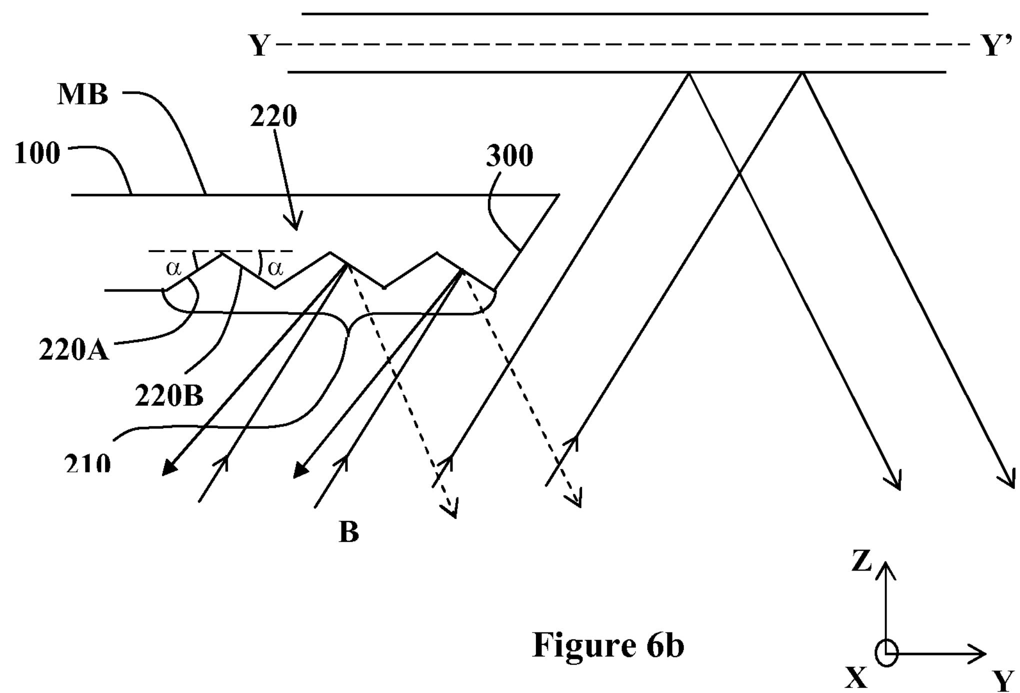

The diffusing region 210 may comprise a plurality of facet portions 220 as depicted in FIGS. 6*a* and 6*b*. The facet portions 220 may be arranged substantially across the diffusing region 210 of the second surface 200. Each facet portion 220 comprises a first facet surface 220A and a second facet surface 220B. The first facet surface 220A and second facet surface 220B are arranged so as to converge at a point or apex that protrudes in a direction away from the second surface 200.

FIG. 6*a* depicts an embodiment of a masking blade comprising a second surface 200 having a plurality of facet portions 220, wherein each facet portion comprises a first facet surface 220A inclined in a first direction at a minimum predetermined facet angle $\alpha$ (relative to an axis YY' that is substantially parallel to the plane of the patterning device MA), and a second facet surface 220B extending in a direction substantially perpendicularly with respect to the patterning device MA.

FIG. 6*b* depicts an embodiment of a masking blade comprising a second surface 200 having a plurality of facet portions 220, wherein each facet portion comprises a first facet surface 220A inclined in a first direction at a minimum predetermined facet angle $\alpha$ and a second facet surface 220B inclined in a second, opposing direction at the same minimum predetermined facet angle $\alpha$. In an alternative arrangement (not illustrated), the first and second facet surfaces 200A, 200B are inclined at different angles.

The minimum predetermined facet angle $\alpha$ of the facet portions 220 may be selected such that at least a portion (possibly substantially all) of the radiation reflected by an inclined facet surface cannot be captured by the projection system and therefore cannot expose the substrate W. More specifically, the minimum predetermined facet angle $\alpha$ may be selected such that, when a facet surface is inclined at the minimum predetermined angle $\alpha$ or at a greater angle, incident radiation is reflected in a predetermined direction at a predetermined angle such that at least a portion (possibly substantially all) of the reflected radiation does not fall within the angular capture range of projection system PL. Hence, the minimum predetermined facet angle $\alpha$ may be selected in accordance with the object-side numerical aperture of the projection system PL.

The minimum predetermined facet angle $\alpha$ of a facet portion 220 of a masking blade MB may be defined by equation 3:

$$\alpha > \beta \quad (3)$$

where $\beta$ is the maximum angle subtended by radiation that can be captured by the projection system. Since $\beta$ is the angle determining the object-side numerical aperture of the projection system PL as shown in equation 2, $\beta$ is necessarily greater than zero.

One or both facet surfaces may be inclined at an angle (facet angle) which is such that reflected radiation does not fall within the angular capture range ACR of the projection system PL. The facet angle may be such that reflected radiation is not incident upon the projection system. The facet angle may be such that radiation is reflected towards and captured by the illumination system IL (i.e. radiation is reflected by the facet portion such that it falls within an angular capture range of an exit of the illumination system IL). The facet angle may be such that radiation is reflected towards and incident upon a beam dump. This may be done for example if the intensity of the source SO is such that reflecting the radiation to the illumination system IL would cause an undesirable degree of heating of the illumination system.

As an example, in an EUV lithographic apparatus the numerical aperture at the exit of the projection system PL may be 0.25. Since the projection system has a reduction factor of 4, this corresponds with a numerical aperture of 0.0625 at the entrance of the projection system PL. Assuming that the refractive index n is 1, equation 2 may be used to calculate that the maximum angle subtended by radiation that can be captured by the projection system $\beta$=3.6 degrees. Equation 3 indicates that the facet angle therefore should be greater than 3.6 degrees.

In an alternative example, the numerical aperture at the exit of the projection system PL may be 0.40, which corresponds with a numerical aperture of 0.10 at the entrance of the projection system. Assuming that the refractive index n is 1, equation 2 may be used to calculate that the maximum angle subtended by radiation that can be captured by the projection system $\beta$=5.7 degrees. Equation 3 indicates that the facet angle therefore should be greater than 5.7 degrees.

The facet portions 220 shown in FIGS. 6*a* and 6*b* have two facet surfaces 220A, 220B. These facet surfaces may extend across the diffusing region 210 of the masking blade MB. In an alternative arrangement (not shown), the facet portions may have more than two facet surfaces. The facet portions may for example have three facet surfaces, the facet portions being provided as pyramids with triangular bases. The facet portions may for example have four facet surfaces, the facet portions being provided as pyramids with rectangular or square bases. The facet portions may have other numbers of facet surfaces.

The facet portions may be configured to direct reflected radiation towards a plurality of beam dumps. For example, each facet surface of a given facet portion may configured to direct reflected radiation towards a different beam dump. For example, three beam dumps may arranged to receive reflected radiation from facet portions having three facet surfaces. This may help to spread the thermal load of the reflected radiation.

By controlling the reflection of radiation from the second surface of the masking blade MB as described, one or more problems associated with stray radiation irradiating the substrate W are reduced or avoided. For example, the effect of “flare” may be reduced, the contrast between the irradiated target portion and border region may be improved, and/or the resolution and process latitudes of the lithographic apparatus may be improved. Hence, the overall imaging performance of the lithographic apparatus may be enhanced.

The reflection of radiation may be further or alternatively controlled by configuring the masking edge 300 of the masking blade MB such that at least a portion of the radiation reflected by the masking edge 300 may not be captured by the projection system PL. The masking edge 300 of the masking blade MB may be configured such that at least a majority portion or even substantially all of the reflected radiation is not captured by projection system PL.

The reflection of radiation may be controlled by tapering the masking edge 300 such that it is inclined at a minimum predetermined angle θ relative to an axis ZZ' that is perpendicular to the patterning device, as depicted in FIG. 7. The minimum predetermined angle θ of the masking edge 300 is selected such that at least a portion (possibly substantially all) of the radiation reflected by the masking edge 300 is not captured by the projection system PL. More specifically, the minimum predetermined angle θ is selected such that, when the masking edge is inclined at the minimum predetermined angle θ or above, radiation is reflected in a predetermined direction at a predetermined angle such that at least a portion (possibly substantially all) of the radiation does not fall within the angular capture range ACR of the projection system PL.

The minimum predetermined angle θ of the masking edge 300 may be such that reflected radiation is not incident upon the projection system. The angle may be such that radiation is reflected towards and captured by the illumination system IL (i.e. radiation is reflected by the masking edge 300 such that it falls within an angular capture range of an exit of the illumination system IL). The angle may be such that radiation is reflected towards and incident upon a beam dump.

For a y-axis masking blade MB, wherein the masking edge 300 is aligned parallel to the x-axis of the lithographic system, the minimum predetermined angle θ of the masking edge 300 may be defined by equation 4:

$$\theta>\beta+\phi \qquad 4$$

where β is the maximum angle of incidence for radiation that can be captured by the projection system and ϕ is the centroid angle of incidence of the incident radiation. The term 'centroid angle of incidence' refers to the angle of incidence of radiation incident on the masking edge 300 relative to the axis ZZ'. A typical EUV lithographic apparatus is not telecentric in the y-direction, and hence the angle ϕ is not zero, but instead may for example be a few degrees (typically less than 20 degrees).

Manufacturing tolerances may limit the accuracy with which the angle of the masking edge 300 may be formed. For this reason, the calculation of the minimum predetermined angle θ may include an extra angle δ which is intended to avoid the possibility that the manufacturing tolerance reduces the angle of the edge such that radiation is coupled into the projection system PL. The minimum predetermined angle may thus be expressed as:

$$\theta>\beta+\phi+\delta \qquad 5$$

As an example, in an EUV lithographic apparatus the numerical aperture at the exit of the projection system PL may be 0.25. Since the projection system has a reduction factor of 4, this corresponds with a numerical aperture of 0.0625 at the entrance of the projection system. Assuming that the refractive index n is 1, equation 2 may be used to calculate that β=3.6 degrees. The manufacturing tolerance may be such that 0.5 degrees should be added to the minimum predetermined angle (i.e. δ=0.5). If the angle of incidence is 6 degrees, then equation 5 indicates that the minimum predetermined angle θ of the masking edge 300 is 10.1 degrees.

In an alternative example, the numerical aperture at the exit of the projection system PL may be 0.40, which corresponds with a numerical aperture of 0.10 at the entrance of the projection system. Assuming that the refractive index n is 1, equation 2 may be used to calculate that β=5.7 degrees. If the angle of incidence is 6 degrees and the manufacturing tolerance is 0.5 degrees, then equation 5 indicates that the minimum predetermined angle θ of the masking edge 300 is 12.2 degrees.

For an x-axis masking blade MB, wherein the masking edge 300 is aligned parallel to the y-axis of the lithographic system, the minimum predetermined angle θ of the tip of the masking edge 300 may be defined by equation 6:

$$\theta>\beta \qquad 6$$

where angle β is the maximum angle of incidence for radiation that can be captured by the projection system. A typical EUV lithographic apparatus is telecentric in the x-direction, and hence the angle ϕ is zero.

An extra angle δ may be added to take account of manufacturing tolerances, as indicated in equation 7:

$$\theta>\beta+\delta \qquad 7$$

By controlling the reflection of the stray radiation from the masking edge 300 of the masking blade MB as described above, the problem of flare at the substrate may be reduced or overcome, ghost images may be avoided, the contrast between the target portion and border region may be improved and/or the resolution and process latitudes of the lithographic apparatus may be improved. Accordingly, the overall imaging performance of the lithographic apparatus may be improved.

It may be possible for incident radiation to be reflected by a masking edge 300 of a first masking blade MB1 towards the patterning device MA, patterned and reflected by the patterning device MA towards the masking edge 300 of the second masking blade MB2, and then reflected by the masking edge of the second masking blade MB2. The radiation reflected by the masking edge 300 of the second masking blade MB2 may fall within the angular capture range of the projection system PL. However, this radiation has been displaced in the y-axis. Accordingly, the displaced radiation follows a different optical path through the projection system PL relative to the optical path of desired radiation, and may create a ghost image when it reaches the substrate W.

In order to avoid this problem, the lithographic apparatus may comprise an aperture stop to control (e.g. intercept or block) the displaced radiation, and thereby prevent it from reaching the substrate. The aperture stop may extend laterally across the optical path of the displaced radiation beam in the projection system PL. For example, the lithographic apparatus may comprise a dynamic gas lock (DGL) which is arranged in the field plane of the projection system PL so as to intercept or block the displaced radiation. By inhibiting or restricting the passage of the displaced radiation through the projection system PL, problems caused by stray radiation may be further reduced, minimized or avoided.

The lithographic apparatus may comprise a field stop (not illustrated) provided at the entrance of the projection system PL. The field stop may be configured to block radiation which would be incident upon the first reflective element 28 of the projection system but would not be captured by the projection system (i.e. the radiation is incident upon the first reflective element but falls outside of the numerical aperture). The field stop may include a cooling system. The cooling system may for example comprise a fluid which may be pumped around the field stop and used to carry heat away from the field stop.

So as to help further control the reflection of radiation by a masking blade, the masking blade MB may comprise a material that is more absorbent to incident radiation than conventional masking blade materials. The masking blade may comprise a metal material (e.g. titanium) that is more absorbent of incident radiation than conventional masking blade materials. As an example, only approximately 5% of DUV radiation with a wavelength of about 193 nm is reflected by a masking blade comprising titanium compared with approximately 10% reflection by a conventional steel masking blade.

An embodiment of the present invention seeks to control the reflection of radiation in a lithographic apparatus so as to reduce, minimize or prevent exposure of the substrate by stray radiation. This is achieved by controlling the reflection of radiation from the masking blade such that at least a portion of the reflected radiation is not captured by the projection system. The masking blade is configured to reflect radiation in predetermined direction at a predetermined angle such that at least a portion of the reflected radiation falls outside the angular capture range of projection system. By limiting or preventing the capture of reflected radiation by the projection system, the exposure of a substrate by stray radiation is substantially restricted or inhibited. Accordingly, the adverse effects of stray radiation may be diminished or reduced and the imaging performance of a lithographic apparatus is improved or enhanced.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out.

The invention claimed is:

1. A lithographic apparatus comprising:

an illumination system configured to condition a beam of extreme ultra-violet radiation;

a support configured to hold a reflective patterning device, the reflective patterning device configured to impart a pattern to the beam of extreme ultra-violet radiation;

a substrate table configured to hold a substrate;

a projection system configured to project the patterned beam of extreme ultra-violet radiation onto a target portion of the substrate; and a masking device configured to control illumination of the reflective patterning device by the beam of extreme ultra-violet radiation, the masking device comprising a masking blade including a masking edge configured to delimit a boundary of an illumination region on the reflective patterning device, and a masking surface having a plurality of facet surfaces, wherein each of the facet surfaces is inclined in a first direction at an angle greater than a maximum angle subtended by radiation that can be captured by the projection system to reflect a portion of the beam of extreme ultra-violet radiation incident on the masking blade such that the reflected extreme ultra-violet radiation is not captured by the projection system.

2. The apparatus of claim 1, wherein the masking surface comprises a plurality of facet portions, each facet portion comprising a first facet surface and a second facet surface of the plurality of facet surfaces arranged to converge at a point that protrudes in a direction away from the masking surface, wherein the first facet surface is inclined in the first direction at the angle greater than the maximum angle subtended by radiation that can be captured by the projection system.

3. The apparatus of claim 2, wherein the second facet surface is inclined in a second direction at an angle greater than the maximum angle subtended by radiation that can be captured by the projection system.

4. The apparatus of claim 2, wherein the facet portions comprise three or more facet surfaces.

5. The apparatus of claim 4, wherein the three or more facet surfaces are each configured to reflect the radiation towards a different beam dump.

6. The apparatus of claim 1, wherein the masking edge is inclined at an inclination angle greater than a certain angle, the inclination angle being such that at least a portion of radiation reflected from the masking edge falls outside the angular capture range of the projection system.

7. The apparatus of claim 6, wherein the certain angle is the maximum angle subtended by radiation that can be captured by the projection system.

8. The apparatus of claim 6, wherein when the certain angle is the sum of the maximum angle subtended by radiation that can be captured by the projection system and a centroid angle of incidence for radiation incident on the masking edge.

9. The apparatus of claim 1, wherein the masking blade comprises a metallic material.

10. The apparatus of claim 9, wherein the metallic material is titanium.

11. The apparatus of claim 1, wherein the masking blade is configured to reflect the radiation towards the illumination system.

12. The apparatus of claim 1, wherein the masking blade is configured to reflect the radiation towards a beam dump.

13. A method of controlling reflection of extreme ultra-violet radiation in a lithographic apparatus, the method comprising:

projecting a beam of extreme ultra-violet radiation toward a reflective patterning device of the lithographic apparatus; and using a masking blade including a masking edge configured to delimit a boundary of an illumination region on the reflective patterning device and disposed before the reflective patterning device in the optical path of the beam of extreme ultra-violet radiation to reflect at least a portion of the extreme ultra-violet radiation at an angle which is equal to or greater than a certain angle, such that at least a portion of the reflected extreme ultra-violet radiation is not captured by a projection system of the lithographic apparatus, wherein the masking blade further includes a masking surface having a plurality of facet surfaces, each of the facet surfaces is inclined in a first direction at an angle greater than a maximum angle subtended by radiation that can be captured by the projection system to reflect a portion of the beam of extreme ultra-violet radiation incident on the masking blade such that the reflected extreme ultra-violet radiation is not captured by the projection system.

14. A masking device for a reflective patterning device in a lithographic apparatus, the masking device comprising a masking blade including a masking edge configured to delimit a boundary of an illumination region on the reflective patterning device and a masking surface having a plurality of facet surfaces, wherein each of the facet surfaces is inclined in a first direction at an angle greater than a maximum angle subtended by radiation that can be captured by a projection system of the lithographic apparatus to reflect extreme ultra-violet radiation such that at least a portion of the reflected extreme ultra-violet radiation falls outside an angular capture range of captured by the projection system of the lithographic apparatus.

* * * * *